(12) United States Patent
Hamano et al.

(10) Patent No.: US 10,508,362 B2
(45) Date of Patent: Dec. 17, 2019

(54) SUBSTRATE MOUNTING MEMBER, WAFER PLATE, AND SIC EPITAXIAL SUBSTRATE MANUFACTURING METHOD

(71) Applicant: Mitsubishi Electric Corporation, Tokyo (JP)

(72) Inventors: Kenichi Hamano, Tokyo (JP); Hiroaki Sumitani, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 123 days.

(21) Appl. No.: 15/358,543

(22) Filed: Nov. 22, 2016

(65) Prior Publication Data
US 2017/0283984 A1 Oct. 5, 2017

(30) Foreign Application Priority Data
Mar. 30, 2016 (JP) .................. 2016-068264

(51) Int. Cl.
| | | |
|---|---|---|
| C23C 14/50 | (2006.01) | |
| C30B 23/02 | (2006.01) | |
| C30B 29/36 | (2006.01) | |
| C23C 16/32 | (2006.01) | |

(Continued)

(52) U.S. Cl.
CPC ............ *C30B 23/025* (2013.01); *C23C 14/50* (2013.01); *C23C 16/325* (2013.01);
(Continued)

(58) Field of Classification Search
CPC ......... C30B 25/12; C30B 29/36; C30B 31/14; C30B 25/02; C30B 35/00; C30B 25/08;
(Continued)

(56) References Cited

U.S. PATENT DOCUMENTS

| | | | | |
|---|---|---|---|---|
| 5,820,686 A | * | 10/1998 | Moore | ................ C23C 16/4581 |
| | | | | 118/730 |
| 6,217,662 B1 | * | 4/2001 | Kong | .................. C23C 16/4582 |
| | | | | 118/723 I |

(Continued)

FOREIGN PATENT DOCUMENTS

| | | | | |
|---|---|---|---|---|
| JP | 03-199196 A | | 8/1991 | |
| JP | 2007273660 A | * | 10/2007 | ........... H01L 21/206 |

(Continued)

OTHER PUBLICATIONS

European Patent Office, English Computer translation of JP 2007273660 (Year: 2018).*

(Continued)

*Primary Examiner* — Matthew J Song
(74) *Attorney, Agent, or Firm* — Studebaker & Brackett PC

(57) ABSTRACT

A substrate mounting member according to the present invention is a member for mounting a SiC substrate for epitaxial growth, which includes a wafer plate including a SiC polycrystal, and a supporting plate configured to be placed on the wafer plate, include no SiC polycrystal and have a surface serving as a SiC substrate placing surface, the surface being on the side opposite to a surface in contact with the wafer plate, and in which a thickness h [mm] of the supporting plate satisfies an expression $h^4 \leq 3 \, pa^4(1-v^2)\{(5+v)/(1+v)\}/16E$ when a force applied to a unit area of the supporting plate by a self-weight of the supporting plate and by the SiC substrate is represented as p [N/mm$^2$], a radius of the supporting plate as a [mm], a Poisson's ratio as v and a Young's modulus as E [MPa].

9 Claims, 4 Drawing Sheets

(51) Int. Cl.
*C23C 16/44* (2006.01)
*C23C 16/458* (2006.01)
*C30B 35/00* (2006.01)

(52) U.S. Cl.
CPC ...... *C23C 16/4404* (2013.01); *C23C 16/4581* (2013.01); *C30B 29/36* (2013.01); *C30B 35/002* (2013.01)

(58) Field of Classification Search
CPC .. C23C 16/4581; C23C 14/50; C23C 16/4404
See application file for complete search history.

(56) References Cited

U.S. PATENT DOCUMENTS

| | | | | |
|---|---|---|---|---|
| 2010/0143579 | A1* | 6/2010 | Narahara | C23C 16/4583 427/8 |
| 2012/0164347 | A1* | 6/2012 | Rhee | H01L 21/68757 427/553 |
| 2013/0327274 | A1 | 12/2013 | Ohno et al. | |
| 2015/0072100 | A1* | 3/2015 | Genba | C30B 25/12 428/64.1 |
| 2018/0100235 | A1* | 4/2018 | Nogami | C30B 25/12 |

FOREIGN PATENT DOCUMENTS

| | | |
|---|---|---|
| JP | 2013-254853 A | 12/2013 |
| JP | 2015-146416 A | 8/2015 |

OTHER PUBLICATIONS

Office Action mailed by the Japanese Patent Office dated Feb. 5, 2019, which corresponds to Japanese Patent Application No. 2016-068264 and is related to U.S. Appl. No. 15/358,543.

* cited by examiner

F I G. 1
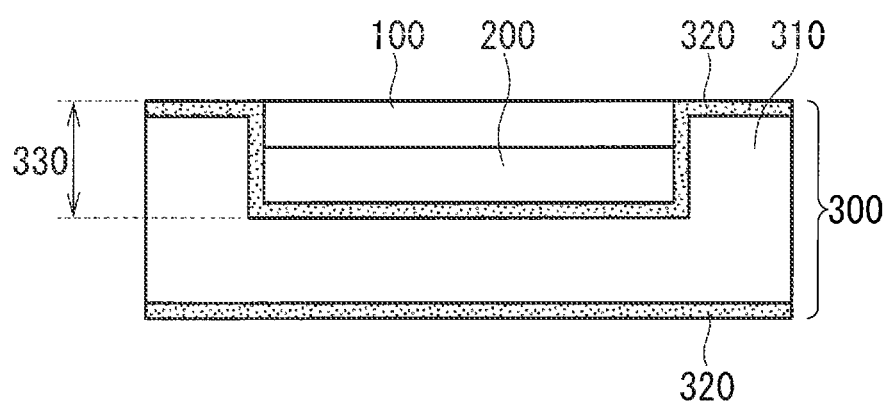

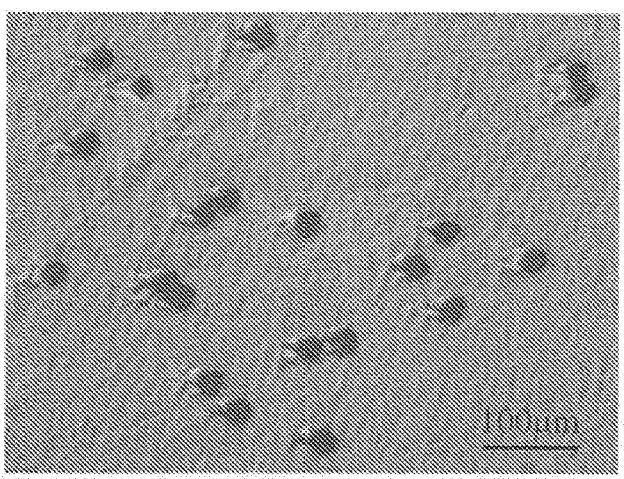
F I G. 3
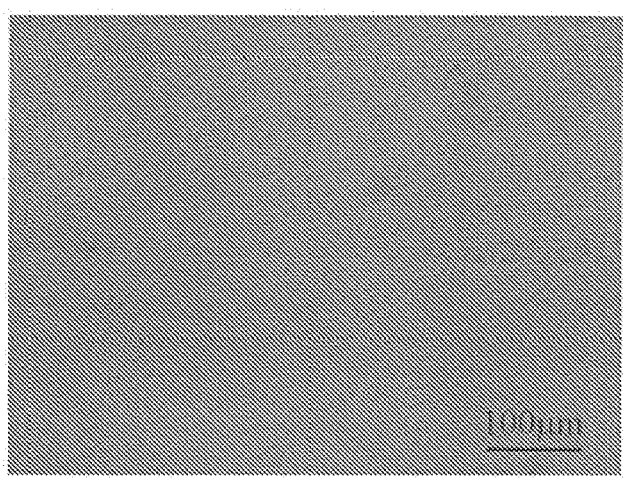
F I G. 4
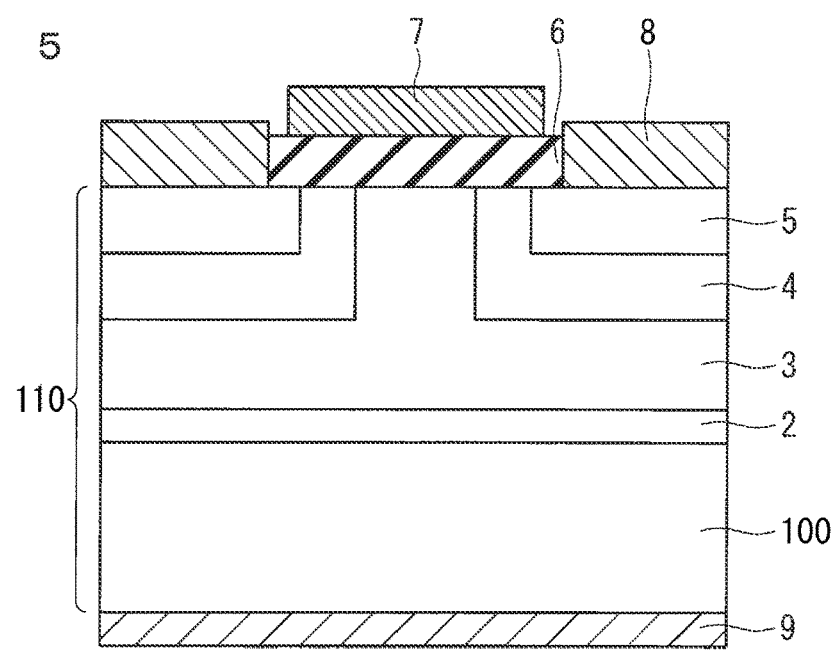
F I G. 5

SUBSTRATE MOUNTING MEMBER, WAFER PLATE, AND SiC EPITAXIAL SUBSTRATE MANUFACTURING METHOD

BACKGROUND OF THE INVENTION

Field of the Invention

The present invention relates to manufacture of a SiC epitaxial substrate.

Description of the Background Art

In general, for epitaxial growth on a SiC substrate, a SiC-coated wafer plate made of carbon is mounted as a SiC substrate mounting member in a SiC-coated susceptor made of carbon and a SiC substrate is arranged on the wafer plate. Then, the carbon-made susceptor is heated up to an epitaxial growth temperature by induction heating. On this occasion, since SiC coated on the wafer plate is a polycrystal, SiC sublimates at the epitaxial growth temperature. Then, since a back surface of the SiC substrate is in contact with the wafer plate, a SiC sublimate is adhered to the back surface of the SiC substrate whose temperature is lower than that of the wafer plate to three-dimensionally grow, resulting in forming a protrusion. Since the protrusion deteriorates flatness of the SiC substrate, abnormality occurs during a wafer process to cause deteriorations in characteristics and yields of a semiconductor device.

Additionally, the protrusion is firm because of bonding of SiC. Therefore, while back surface grinding is among protrusion removal methods, the back surface grinding makes a work period longer because of addition of a step for forming a protective film on a top surface of the substrate and a step of removing the protective film. Additionally, SiC has a high hardness and consumes a large quantity of grindstone at the time of grinding, resulting in causing an increase in costs.

Regarding this problem, Japanese Patent Application Laid-Open No. 2015-146416 discloses a configuration in which a supporting plate uncoated with SiC is mounted between a SiC substrate and a wafer plate. According to this configuration, since a SiC sublimate which is sublimated from the wafer plate is adhered not to a back surface of the SiC substrate but to the supporting plate, flatness of the back surface of the SiC substrate is increased.

However, in the configuration recited in Japanese Patent Application Laid-Open No. 2015-146416, a SiC sublimate adhered to a back surface of a substrate supporting member causes curvature of the substrate supporting member, so that contact surfaces vary between the wafer plate and the supporting plate and between the supporting plate and the SiC substrate. Accordingly, during epitaxial growth and in each epitaxial growth, a SiC substrate in-plane temperature distribution varies to make it difficult to obtain stable epitaxial growth characteristics.

Additionally, for the purpose of preventing a turbulent flow of gas during epitaxial growth, it is a common practice to reduce a height difference between a top surface of a SiC substrate and a top surface of a wafer plate. Then, in a case of a device in which a SiC substrate rotates or rotates/revolves, curvature generated in a supporting plate causes the SiC substrate to come out of a counterbore portion of the wafer plate during growth and prevent normal growth of the same, resulting in causing a reduction in yields of epitaxial growth.

SUMMARY OF THE INVENTION

An object of the present invention is to suppress adhesion of SiC to a back surface of a SiC substrate at the time of epitaxial growth on the SiC substrate and maintain a uniform SiC substrate in-plane temperature distribution.

A first substrate mounting member of the present invention is a SiC substrate mounting member for epitaxial growth and includes a wafer plate and a supporting plate. The wafer plate includes a SiC polycrystal. The supporting plate is placed on the wafer plate, includes no SiC polycrystal and has a surface serving as a SiC substrate placing surface, the surface being on the side opposite to a surface in contact with the wafer plate. A thickness h [mm] of the supporting plate satisfies an expression $h^4 \leq 3\, pa^4(1-v^2)\{(5+v)/(1+v)\}/16E$ when a force applied to a unit area of the supporting plate by a self-weight of the supporting plate and by the SiC substrate is represented as p [N/mm$^2$], a radius of the supporting plate as a [mm], a Poisson's ratio as v and a Young's modulus as E [MPa].

The first substrate mounting member of the present invention can suppress generation of a SiC protrusion on a back surface of the SiC substrate because a SiC sublimate which is sublimated from the wafer plate is adhered to the supporting plate. Additionally, according to the first substrate mounting member of the present invention, since an upper limit of a thickness of the supporting plate is defined, curvature of the supporting plate can be suppressed when the SiC substrate is placed on the supporting plate. Accordingly, variation in contact areas between the supporting plate and the wafer plate and between the supporting plate and the SiC substrate can be suppressed to maintain a uniform SiC substrate in-plane temperature distribution.

A second substrate mounting member of the present invention is a SiC substrate mounting member for epitaxial growth and includes a wafer plate and a supporting plate. The wafer plate includes a SiC polycrystal. The supporting plate is placed on the wafer plate and includes no SiC polycrystal. The SiC substrate, in a state of being mounted, is located above the supporting plate so as to be spaced apart therefrom.

The second substrate mounting member of the present invention can suppress generation of a SiC protrusion on a back surface of the SiC substrate because a SiC sublimate which is sublimated from the wafer plate is adhered to the supporting plate. Additionally, according to the second substrate mounting member of the present invention, even when the supporting plate is curved due to adhesion of a SiC sublimate, a contact/non-contact relation with the SiC substrate remains in a non-contact state because the supporting plate and the SiC substrate are spaced apart from each other. Accordingly, a uniform SiC substrate in-plane temperature can be maintained.

The wafer plate of the present invention includes a mounting portion on which the SiC substrate is mounted. With the SiC substrate mounted on the mounting portion, the wafer plate of the present invention includes no SiC polycrystal immediately under the SiC substrate and includes SiC polycrystals in the remaining regions.

The wafer plate of the present invention can suppress generation of a SiC protrusion on the back surface of the SiC substrate because a SiC sublimate is hardly generated immediately under the SiC substrate. Additionally, since the wafer plate of the present invention is provided with no supporting plate, a SiC substrate in-plane temperature distribution cannot vary which is caused by curvature of the supporting plate.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a sectional view showing a configuration of a substrate mounting member according to a first preferred embodiment;

FIG. 3 is a view showing a back surface of a SiC epitaxial substrate according to a comparative example;

FIG. 4 is a view showing a back surface of a SiC epitaxial substrate produced so as to be mounted on the substrate mounting member according to the first preferred embodiment;

FIG. 5 is a sectional view showing a configuration of a MOSFET (Metal Oxide Semiconductor Field Effect Transistor) produced using the SiC epitaxial substrate;

DESCRIPTION OF THE PREFERRED EMBODIMENTS

A. First Preferred Embodiment

A-1. SiC Epitaxial Substrate

Figure 2:
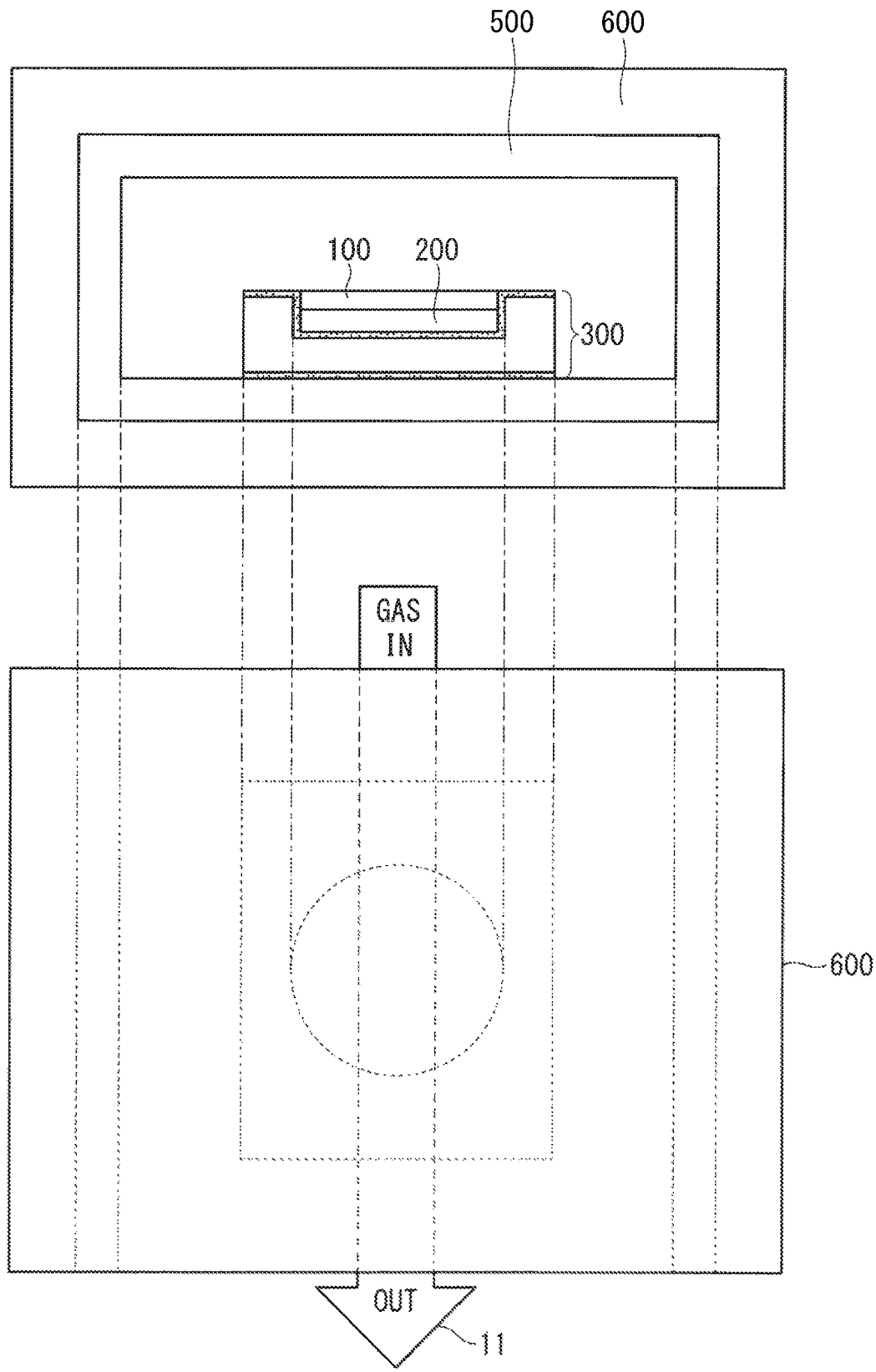
FIG. 2 is a view showing a state where the substrate mounting member is arranged in an epitaxial growth furnace.

FIG. 1 is a sectional view showing a configuration of a substrate mounting member according to a first preferred embodiment. The substrate mounting member is a member on which a SiC substrate is mounted when a SiC substrate is epitaxially grown. The substrate mounting member according to the first preferred embodiment is configured to include a wafer plate 300 and a supporting plate 200.

The wafer plate 300 is configured to include a carbon member 310, and a SiC coat 320 that covers the carbon member 310. The carbon member 310 has a counterbore portion having a bottom surface on which the supporting plate 200 is placed. The supporting plate 200 is also a carbon member but not coated with SiC. In the counterbore portion, on the supporting plate 200, a SiC substrate 100 is placed.

With the SiC substrate 100 placed on the supporting plate 200, an upper surface of the SiC substrate 100 and a top surface of the wafer plate 300 are desirably flush with each other, in consideration of which, a depth 330 of the counterbore portion of the wafer plate 300 is designed. As one example, a thickness of the carbon member 310 is assumed to be on the order of 3 mm and a thickness of the SiC coat 320 is assumed to be on the order of 100 μm. Additionally, the depth 330 of the counterbore in which the SiC substrate 100 is arranged is assumed to be on the order of 0.5 mm, a thickness of the supporting plate 200 is assumed to be on the order of 0.08 mm, and a thickness of the SiC substrate 100 is assumed to be on the order of 0.35 mm.

When a force applied to a unit area of the supporting plate 200 by a self-weight of the supporting plate 200 and a weight of the SiC substrate 100 is represented as p [N/mm²], a radius of the supporting plate 200 as a [mm], a Poisson's ratio of the supporting plate 200 as v, a Young's modulus of the supporting plate 200 as E [MPa] and the thickness of the supporting plate 200 as h, deflection occurs in the supporting plate 200 in an amount expressed by $3 pa^4(1-v^2)\{(5+v)/(1+v)\}/16 Eh^3$. From the deflection amount, it can be considered that with a small thickness h of the supporting plate 200, the supporting plate 200 is flat and a contact area between the supporting plate 200 and the SiC substrate 100 is stable. Accordingly, the contact area between the supporting plate 200 and the SiC substrate 100 is stabilized by making the thickness h of the supporting plate 200 satisfy an expression $h^4 \leq 3 pa^4(1-v^2)\{(5+v)/(1+v)\}/16E$.

FIG. 2 shows a state where the substrate mounting member with the SiC substrate 100 placed thereon is arranged in an epitaxial growth furnace. In the state illustrated in FIG. 2, the SiC substrate 100 is surrounded by a carbon-made susceptor 500 coated with SiC on all sides, and further around an outer circumference of the susceptor 500, a heat insulating material 600 is arranged.

Next, description will be made of a method of epitaxially growing the SiC substrate 100 using the epitaxial growth furnace as illustrated in FIG. 2. First, a carrier gas (H2) is flown into the epitaxial growth furnace to start raising temperature. The carrier gas flows in a direction not covered with the susceptor 500. In general, although induction heating is used for raising temperature, resistance heating may be used. When the inside the growth furnace reaches a predetermined temperature, e.g. 1500° C., mono-silane, propane and nitrogen are introduced as a material gas to start epitaxial growth. As a material gas, HCl may be added. Additionally, in place of mono-silane, disilane, dichlorosilane or trichlorosilane may be used or in place of propane, other hydrocarbon gas may be used.

Before epitaxial growth, gas etching may be conducted using $H_2$, HCl or a mixed gas thereof to remove a damaged layer on the top surface of the SiC substrate 100. At this time, a small amount of mono-silane or propane may be included in the etching gas.

After conducting the epitaxial growth for a predetermined time, the amount of mono-silane, propane and nitrogen to be introduced is adjusted to conduct growth until a desired epitaxial film thickness is obtained. After a lapse of the predetermined time, temperature is decreased. This obtains a SiC epitaxial substrate 110 in which an epitaxial layer with a predetermined film thickness is formed on the SiC substrate 100.

A back surface of thus obtained SiC epitaxial substrate 110 is illustrated in FIG. 4. As a comparative example, a back surface of a SiC epitaxial substrate is illustrated in FIG. 3, the SiC epitaxial substrate being obtained when the SiC substrate 100 is placed on a conventional substrate mounting member not including the supporting plate 200 and is epitaxially grown.

When conducting epitaxial growth by induction heating, first, the susceptor 500 is induction-heated, so that the temperature of the wafer plate 300 is increased due to radiation heat from the susceptor 500. The SiC substrate 100 arranged in the wafer plate 300 is also heated by radiation heat and heat conduction from the wafer plate 300. Accordingly, the susceptor 500, the wafer plate 300 and the SiC substrate 100 have higher temperatures in this order. In a case of conventional art, although SiC polycrystals (coated or bulk) of the wafer plate 300 are arranged immediately under the SiC substrate 100, since the SiC polycrystal sublimates at 1400° C. as a SiC epitaxial growth temperature or higher, SiC as a sublimate will be adhered to a back surface of the SiC substrate 100 whose temperature is lower than that of the wafer plate 300 and will grow to form protrusions as illustrated in FIG. 3. Heights of the protrusion are on the order of μm and change depending on a growth time.

However, according to the present preferred embodiment, on the wafer plate 300 coated with SiC, the supporting plate 200 not coated with SiC is mounted, and on the supporting plate 200, the SiC substrate 100 is arranged and epitaxially grown. Then, a sublimate of the SiC coat is adhered to the supporting plate 200 and hardly reaches the back surface of the SiC substrate 100. Accordingly, growth of SiC on the back surface of the SiC substrate 100 is suppressed to suppress formation of SiC protrusions on the back surface of the substrate as illustrated in FIG. 4.

Additionally, in the present preferred embodiment, by setting the thickness h of the supporting plate 200 to satisfy the expression $h^4 \leq 3\ pa^4(1-v^2)\{(5+v)/(1+v)\}/16E$, curvature of the supporting plate 200 is suppressed which is caused when the SiC substrate 100 is placed on the supporting plate 200, so that the contact area between the supporting plate 200 and the SiC substrate 100 is stabilized. Accordingly, in the course of epitaxial growth, local ununiformity of an in-plane temperature distribution of the SiC substrate 100 can be suppressed. This enhances an epitaxial growth rate, i.e. in-plane uniformity of thickness of the epitaxial layer and also enhances in-plane uniformity of an impurity concentration in the epitaxial layer. Additionally, when a plurality of SiC epitaxial substrates are sequentially produced in a growth furnace, variation in characteristics among the respective SiC epitaxial substrates can be suppressed.

Although a lower limit of the thickness of the supporting plate 200 is not particularly defined, the applicant of the present invention has verified that the above-described effect can be obtained with the thickness of 0.05 mm. The smaller the thickness of the supporting plate 200 becomes, the more SiC2, Si2C or the like as a sublimate from the SiC coat is likely to pass through the supporting plate 200 and adhere to the back surface of the SiC substrate 100, resulting in reducing the effect of the present invention.

Specifically, the substrate mounting member of the present preferred embodiment is a member for mounting a SiC substrate for epitaxial growth, which includes the wafer plate 300 containing SiC polycrystals, and the supporting plate 200 placed on the wafer plate 300, containing no SiC polycrystal and has a surface serving as a placing surface of the SiC substrate 100, the surface being opposite to the side of a surface in contact with the wafer plate 300. Accordingly, adhesion of a SiC sublimate to the back surface of the SiC substrate 100 can be prevented by the supporting plate 200. Additionally, the thickness h of the supporting plate 200 satisfies the expression $h^4 \leq 3\ pa^4(1-v^2)\{(5+v)/(1+v)\}/16E$ when the radius of the supporting plate 200 is represented as a (mm), a Poisson's ratio as v and a Young's modulus as E[MPa]. Therefore, curvature of the supporting plate 200 can be suppressed to obtain a stable in-plane temperature distribution of the SiC substrate 100. Accordingly, the SiC epitaxial substrate 110 can be produced to have an excellent yield.

Additionally, the SiC epitaxial substrate manufacturing method of the present preferred embodiment is characterized in that the SiC substrate 100 is mounted on the above-described substrate mounting member to have epitaxial growth on the SiC substrate 100. Accordingly, the SiC epitaxial substrate 110 can be obtained to have the reduced number of SiC protrusions on the back surface thereof and have an excellent yield.

A-2. SiC Device

Next, a SiC device using the SiC epitaxial substrate 110 will be described. FIG. 5 shows a sectional view of a MOSFET (Metal Oxide Semiconductor Field Effect Transistor) as one example of such a SiC device. In the following, description will be made of a method of manufacturing a MOSFET using the SiC epitaxial substrate 110.

The SiC epitaxial substrate 110 includes the SiC substrate 100, a n-type (first conductive type) epitaxial layer 2 formed on the SiC substrate 100, and an epitaxial layer 3 formed on the epitaxial layer 2 and having a n-type impurity concentration lower than that of the epitaxial layer 2.

At places on the epitaxial layer 3 apart from each other at a predetermined interval, a mask such as a resist is formed and ion impurities are implanted to form a pair of p-type (second conductive type) base regions 4. Among impurities to be p-type in the epitaxial layer 3 are, for example, boron (B) and aluminium (Al).

Further, in each base region 4, a mask is formed using a resist or the like and n-type impurities are ion-implanted to form a n-type (second conductive type) source region 5 on a front layer of each base region 4, and thereafter, the mask is removed. Among n-type impurities are, for example, phosphor (P) and nitrogen (N). Subsequently, when the wafer is subjected to heat treatment at a high temperature by a heat treating device, n-type and p-type implanted ions are electrically activated.

Next, across a top surface of the base region 4 and a top surface of the epitaxial layer 3, a gate insulating film 6 is formed. The gate insulating film 6 is formed by thermal oxidation or deposition. Thereafter, on the gate insulating film 6, a gate electrode 7 is film-formed and patterned. The gate electrode 7 is patterned in a shape in which paired base region 4 and source region 5 are located at both end portions and an exposed epitaxial layer 3 is located at the center between the base regions 4.

Further, a remaining part of the gate insulating film 6 on each source region 5 is removed by lithography and etching, and after the removal, a source electrode 8 is film-formed and patterned in a part in which the source region 5 is exposed. Then, forming a drain electrode 9 on the back surface side of the substrate 100 completes main parts of an element structure of the MOSFET as illustrated in FIG. 5.

Figure 6:
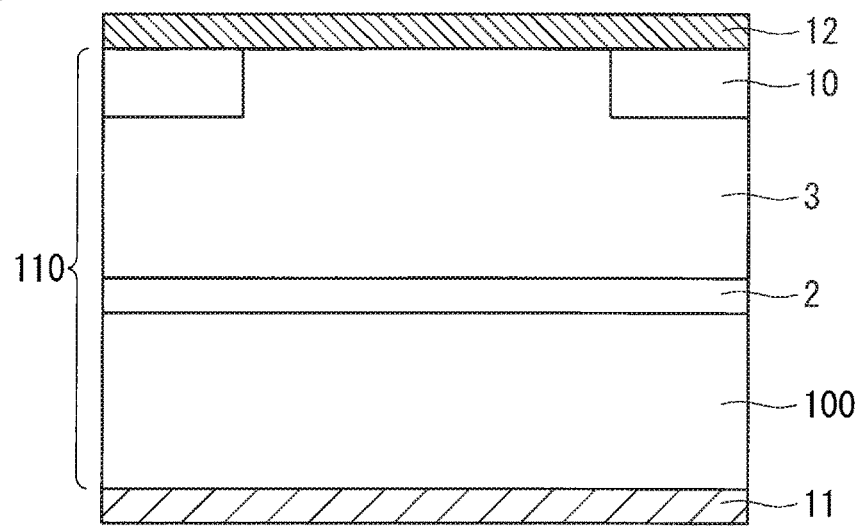
FIG. 6 is a sectional view showing a configuration of a SBD produced using the SiC epitaxial substrate.

FIG. 6 shows a sectional view of a Schottky diode as an example of another SiC device using the SiC epitaxial substrate 110. In the following, description will be made of a method of manufacturing a Schottky diode using the SiC epitaxial substrate 110.

First, the top surface of the epitaxial layer 3 in the SiC epitaxial substrate 110 is subjected to sacrificial oxidation Next, for producing a termination structure 10 aimed at increasing a breakdown voltage, a photoresist patterning mask having a desired pattern is formed on the top surface of the epitaxial layer 3. Then, from above the mask, impurity ions are implanted to form an ion-implanted layer in the epitaxial layer 3 and then, the mask and the sacrificially oxidized film are removed.

Thereafter, by conducting activation annealing for activating the implanted impurity atoms, the p-type (second conductive type) termination structure 10 is formed. Lastly, an ohmic electrode 11 is formed on the back surface of the SiC epitaxial substrate 110 to form a Schottky electrode 12 on a top surface thereof. Thus, a SiC-SBD is completed.

While the above description is made of MOSFET and SBD, other SiC device can be produced using the SiC epitaxial substrate 110. Since the SiC epitaxial substrate 110 has the reduced number of SiC protrusions on the back surface thereof to have less variation in epitaxial growth characteristics, use of this substrate enables a SiC device to be produced with an excellent yield.

B. Second Preferred Embodiment

While in the first preferred embodiment, an upper limit of the thickness of the supporting plate 200 is defined, in the second preferred embodiment, a thickness of a supporting plate 200 may exceed the upper limit. In this case, however, since the supporting plate 200 might not be made flat just by a self-weight of the supporting plate 200 and a weight of a SiC substrate 100, the supporting plate 200 is configured not to affect a contact condition with the SiC substrate 100 even when the plate is curved.

Figure 7:
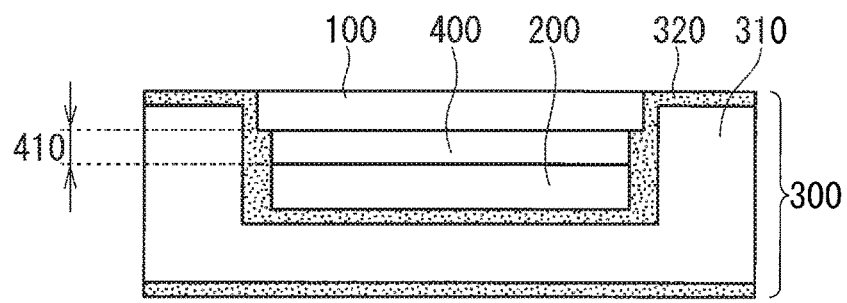
FIG. 7 is a sectional view showing a configuration of a substrate mounting member according to a second preferred embodiment.

FIG. 7 is a sectional view showing a configuration of a substrate mounting member according to the second preferred embodiment. Specifically, in the second preferred embodiment, the SiC substrate 100 is arranged on the supporting plate 200 with a gap 400 provided inbetween. For example, as illustrated in FIG. 7, a step is provided on a side surface of a counterbore portion in a wafer plate 300 and the SiC substrate 100 is placed in the step portion, while the supporting plate 200 is placed on a bottom surface of the counterbore portion, thereby providing the gap 400 between the supporting plate 200 and the SiC substrate 100.

Thus, even when the supporting plate 200 and the SiC substrate 100 are arranged spaced apart from each other, placing the supporting plate 200 below a back surface of the SiC substrate 100 eliminates presence of a SiC coat immediately under the back surface of the SiC substrate 100. In other words, a sublimate from the SiC coat formed on the bottom surface of the counterbore portion adheres to the supporting plate 200 and hardly reaches the back surface of the SiC substrate 100, so that formation of protrusions can be suppressed on the back surface of the SiC substrate 100.

Additionally, since even when the supporting plate 200 is curved, the plate will not come into contact with the SiC substrate 100, a temperature distribution will not vary on the back surface of the SiC substrate 100, so that stable epitaxial growth characteristics can be obtained in each epitaxial growth.

A size of the gap 400 is determined in consideration of that even when the supporting plate 200 is curved, the plate will not come into contact with the SiC substrate 100. According to the experiment conducted by the applicant, it was found that assuming the thickness of the supporting plate 200 to be 1 mm, epitaxial growth causes generation of a convex-shaped curvature on the order of 100 µm. In consideration of that a common 4-inch n-type SiC substrate might have a convex on the order of 40 µm on the back surface side, the gap 400 is preferably 200 µm or greater. In this configuration, the thickness of the supporting plate 200 is not limited, and all or a part of a top surface of the supporting plate 200 may be coated. In such a case, used as a coating material is other material than SiC, for example, TaC.

Specifically, the substrate mounting member according to the second preferred embodiment is a member for mounting the SiC substrate 100 for epitaxial growth, which includes the wafer plate 300 containing SiC polycrystals, and the supporting plate 200 placed on the wafer plate 300 and containing no SiC polycrystal, in which the SiC substrate 100, when mounted, is located above the supporting plate 200 so as to be spaced apart therefrom. Accordingly, adhesion of a SiC sublimate to the back surface of the SiC substrate 100 can be prevented by the supporting plate 200. Additionally, since the supporting plate 200 and the SiC substrate 100 are spaced apart from each other, even when the supporting plate 200 is curved, the supporting plate 200 will not come into contact with the SiC substrate 100, so that a temperature distribution will not vary on the back surface of the SiC substrate 100, thereby obtaining stable epitaxial growth characteristics in each epitaxial growth.

C. Third Preferred Embodiment

Figure 8:
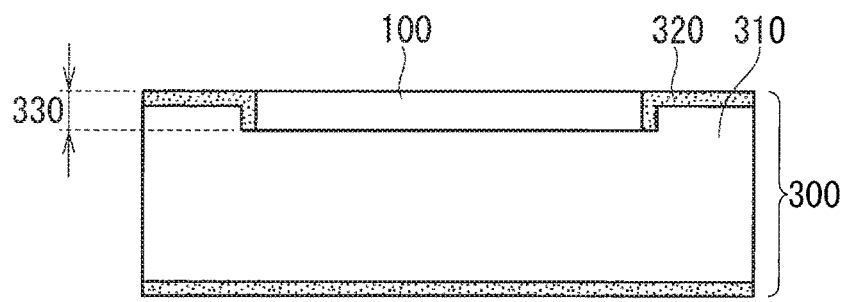
FIG. 8 is a sectional view showing a configuration of a substrate mounting member according to a third preferred embodiment.

FIG. 8 is a sectional view showing a configuration of a wafer plate according to a third preferred embodiment. In the first and second preferred embodiments, with the supporting plate 200 provided, adhering a sublimate from a SiC coat to the supporting plate 200 in place of the SiC substrate 100 suppresses formation of SiC protrusions on the back surface of the SiC substrate 100. By contrast, in the third preferred embodiment, as illustrated in FIG. 8, provision of a supporting plate 200 is omitted and a SiC substrate 100 is placed directly on a bottom surface of a counterbore portion. In other words, a counterbore portion of a wafer plate 300 serves as a SiC substrate mounting portion.

With the SiC substrate 100 placed on the bottom surface of the counterbore portion, an upper surface of the SiC substrate 100 and a top surface of the wafer plate 300 are desirably flush with each other, in consideration of which, the counterbore portion of a depth 330 of the wafer plate 300 is designed.

Additionally, no SiC coat is formed on the bottom surface of the counterbore portion. As a result, since no SiC coat is present immediately under a back surface of the SiC substrate 100, adhesion of a SiC sublimate to the back surface of the SiC substrate 100 can be suppressed.

Specifically, the wafer plate 300 according to the third preferred embodiment includes a mounting portion on which a SiC substrate is mounted. With the SiC substrate 100 mounted on the mounting portion, no SiC polycrystals are contained immediately under the SiC substrate 100 and SiC polycrystals are contained in the remaining regions. Accordingly, adhesion of a SiC sublimate to the back surface of the SiC substrate 100 can be suppressed, and also no provision of the supporting plate 200 prevents variation of an in-plane temperature distribution of the SiC substrate 100, the variation being caused by a change of a contact area between the SiC substrate 100 and the supporting plate 200.

Additionally, a method of manufacturing a SiC epitaxial substrate according to the present preferred embodiment is characterized in mounting the SiC substrate 100 on the above-described wafer plate 300 to have epitaxial growth on the SiC substrate 100. Accordingly, the SiC epitaxial substrate 110 can be obtained to have the reduced number of SiC protrusions on the back surface thereof and have an excellent yield.

D. Fourth Preferred Embodiment

Figure 9:
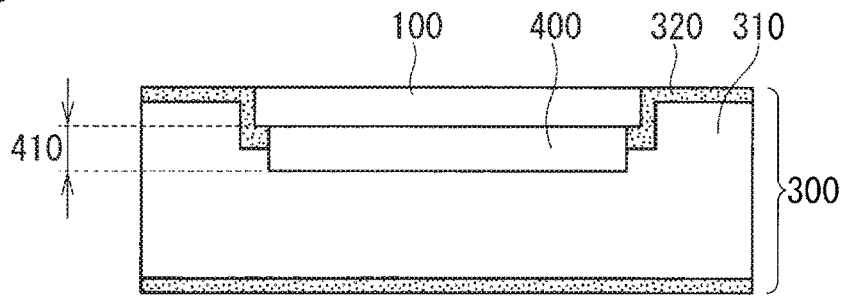
FIG. 9 is a sectional view showing a configuration of a substrate mounting member according to a fourth preferred embodiment.

FIG. 9 is a sectional view showing a configuration of a waver plate according to a fourth preferred embodiment. A wafer plate 300 according to the fourth preferred embodiment is configured such that when a SiC substrate 100 is mounted in a counterbore portion of the wafer plate 300, a gap 400 is formed between a back surface of the SiC substrate 100 and a bottom surface of the counterbore portion. The remaining part is the same as that of the third preferred embodiment.

For example, as illustrated in FIG. 9, providing a step on a side surface of the counterbore portion and placing the SiC substrate 100 in the step portion enables formation of the gap 400. Thus, even when the gap 400 is formed, since no SiC coat is formed on the bottom surface of the counterbore portion, i.e. immediately under the back surface of the SiC substrate 100, adhesion of a sublimate from a SiC coat to the back surface of the SiC substrate 100 can be suppressed during epitaxial growth.

In the wafer plate according to the fourth preferred embodiment, a mounting portion on which the SiC substrate 100 is mounted is the counterbore portion, and with the SiC substrate 100 mounted on the counterbore portion, a gap exists between the SiC substrate 100 and the bottom surface of the counterbore portion. Also with such a configuration, adhesion of a SiC sublimate to the back surface of the SiC substrate 100 can be suppressed, and no provision of the supporting plate 200 prevents variation of an in-plane temperature distribution of the SiC substrate 100, the variation being caused by a change of a contact area between the SiC substrate 100 and the supporting plate 200.

E. Modification Example

In the foregoing description, the wafer plate 300 is configured to include the carbon member 310 and the SiC coat 320. Even when the wafer plate 300 is a SiC polycrystal, however, the effect of the present invention can be obtained. The wafer plate 300 only needs to be configured to contain SiC polycrystals and have a SiC sublimate during epitaxial growth.

Additionally, while it is described that the supporting plate 200 is a carbon member, the plate may have a layered structure of a plurality of carbon plates. Additionally, the plate may be a carbon plate with a carbon-based coat such as a TaC coat. Additionally, the plate may be any substrate made of other material than carbon that will not melt at a SiC epitaxial growth temperature.

Within the scope of the present invention, the invention allows the respective preferred embodiments to be freely combined, appropriately modified or omitted. While the invention has been shown and described in detail, the foregoing description is in all aspects illustrative and not restrictive. It is therefore understood that numerous modifications and variations can be devised without departing from the scope of the invention.

What is claimed is:

1. A substrate mounting member for mounting a SiC substrate for epitaxial growth, comprising:
   a wafer plate including a member having a SiC polycrystal coat covering said member, said member having a counterbore with said SiC polycrystal coat extending along a side wall of said member defining said counterbore and along a surface of said member defining a bottom surface of said counterbore; and
   a supporting plate having a size in relation to a size of said counterbore in plan view of said member such that said supporting plate is configured to be placed directly on said SiC polycrystal coat that extends along said bottom surface of said counterbore, said supporting plate including no SiC polycrystal and having a surface serving as a SiC substrate placing surface onto which said SiC substrate that is received into said counterbore is directly placed, the surface being on the side opposite to a surface in contact with said SiC polycrystal coat that extends along said bottom surface of said counterbore,
   wherein a thickness h [mm] of said supporting plate is 0.08 mm or less and satisfies an expression $h^4 \leq 3pa^4(1-v^2)\{(5+v)/(1+v)\}/16E$ when a force applied to a unit area of said supporting plate by a self-weight of said supporting plate and by said SiC substrate placed directly on said SiC substrate placing surface is represented as p [N/mm$^2$], a radius of said supporting plate as a [mm], a Poisson's ratio as v and a Young's modulus as E [MPa].

2. A method for manufacturing a SiC epitaxial substrate, comprising:
   mounting a SiC substrate on the substrate mounting member according to claim 1; and
   conducting epitaxial growth on said SiC substrate.

3. A substrate mounting member for mounting a SiC substrate for epitaxial growth, comprising:
   a wafer plate including a member having a SiC polycrystal coat covering said member, said member having a counterbore with said SiC polycrystal coat extending along a side wall of said member defining said counterbore and along a surface of said member defining a bottom surface of said counterbore, and a portion of said SiC polycrystal coat that extends along said side wall of said member is thinner than another portion of said SiC polycrystal coat that extends along said side wall of said member to define a step having a surface that extends transverse to said side wall of said member into said counterbore when viewed in plan view of said member, said surface of said step being configured to support said SiC substrate; and
   a supporting plate configured to be placed on said SiC polycrystal coat that extends along said bottom surface of said counterbore, said supporting plate including no SiC polycrystal,
   wherein said SiC substrate, in a state of being mounted on said step, is located above said supporting plate so as to be spaced apart therefrom.

4. A method for manufacturing a SiC epitaxial substrate, comprising:
   mounting a SiC substrate on the substrate mounting member according to claim 2; and
   conducting epitaxial growth on said SiC substrate.

5. A wafer plate comprising a member having a SiC polycrystal coat covering said member which is made of a material, said member having a counterbore with said SiC polycrystal coat extending along a side wall of said member defining said counterbore, said counterbore being arranged as a mounting portion configured to have a SiC substrate mounted thereon, said counterbore having a bottom surface that is an exposed surface of said material of said member including no SiC polycrystal, and said SiC polycrystal coat covering at least a portion of a surface of said member opposite to a surface of said member in which said counterbore is formed,
   wherein with said SiC substrate mounted on said mounting portion, said exposed surface having no SiC polycrystal is included immediately under said SiC substrate and SiC polycrystals are included in the remaining regions corresponding to said SiC polycrystal coat.

6. The wafer plate according to claim 5, wherein
   with said SiC substrate mounted on said counterbore portion, a gap exists between said SiC substrate and said exposed surface of said member.

7. A method for manufacturing a SiC epitaxial substrate, comprising:
- mounting a SiC substrate on the wafer plate according to claim 6; and
- conducting epitaxial growth on said SiC substrate.

8. A method for manufacturing a SiC epitaxial substrate, comprising:
- mounting a SiC substrate on the wafer plate according to claim 5; and
- conducting epitaxial growth on said SiC substrate.

9. The wafer plate according to claim 5, wherein
- a surface of said SiC substrate facing said exposed surface is directly exposed to said exposed surface.

* * * * *